United States Patent [19]
Voss

[11] Patent Number: 5,142,347
[45] Date of Patent: Aug. 25, 1992

[54] POWER SEMICONDUCTOR COMPONENT WITH EMITTER SHORTS

[75] Inventor: Peter Voss, Munich, Fed. Rep. of Germany

[73] Assignee: Siemens Aktiengesellschaft, Munich, Fed. Rep. of Germany

[21] Appl. No.: 614,234

[22] Filed: Nov. 15, 1990

[30] Foreign Application Priority Data

Nov. 28, 1989 [DE] Fed. Rep. of Germany ....... 3939324

[51] Int. Cl.$^5$ ............................................. H01L 29/74
[52] U.S. Cl. ......................................... 357/38; 357/86
[58] Field of Search ...................... 357/38, 86, 51, 20

[56] References Cited

U.S. PATENT DOCUMENTS 5,086,330  2/1992  Minato ................................. 357/38

FOREIGN PATENT DOCUMENTS

2506102C3  3/1982  Fed. Rep. of Germany .
3631136    9/1986  Fed. Rep. of Germany .
2456389   12/1980  France .

OTHER PUBLICATIONS

19th Annual IEEE Power Electronics Specialists Conference Technical Digest, Apr. 14, 1988; New York; T. Ogura et al., "Low Switching Loss, High Power Gate Turn-Off Thyristors (GTOS) with N-Buffer and New Anode Short Structure"; FIG. 9.

Japan Annuals Reviews in Electronics, Computers, and Telecommunications, 13 (1984), "Ideal Ohmic Contact and Application to High-Speed Low-Loss Diodes", Yoshihiro Amemiya et al., pp. 75-87.

Primary Examiner—Mark V. Prenty
Attorney, Agent, or Firm—Hill, Van Santen, Steadman & Simpson

[57] ABSTRACT

In symmetrically blocking thyristors and in diodes, a lowering of the storage charge at the anode side is desirable in some applications. This is achieved by shorts lying in the emitter zone of the anode side. These shorts are formed between zones of a first conductivity type embedded in the emitter zone and zones of a second conductivity type. The zones of the second conductivity type are deeper than those of the first conductivity type and partially overlap the zones of the first conductivity type. Given low current density, these shorts are ineffective; however, they are effective at high current densities. Shorts of this type can also be used at the cathode side in specific diodes that are to be utilized as free-wheeling diodes for GTO thyristors, and can also be employed in asymmetrical GTO thyristors at the anode side.

17 Claims, 3 Drawing Sheets

POWER SEMICONDUCTOR COMPONENT WITH EMITTER SHORTS

BACKGROUND OF THE INVENTION

The invention is directed to a semiconductor component having a semiconductor body with a lightly doped middle zone, a more highly doped outer zone of a first conductivity type adjacent thereto, and shorts between the outer zone and zones of second conductivity type arranged in the outer zone adjoining the surface of the semiconductor body.

Such shorts are often indispensable for the function of thyristors. In symmetrical thyristors they are arranged at the cathode side; in GTO thyristors, they are arranged at the anode side. Shorts at the cathode side have also been disclosed in conjunction with power diodes (DE-25 06 102 and "Japan Annuals Reviews in Electronics, Computers and Telecommunications 13, (1984), pages 75 through 87, both incorporated herein by reference).

An optimally low storage charge in the semiconductor component is desirable for use in power converters and choppers. It is known to reduce the storage charge by driving in metals. The drive-in of metals leads to a general shortening of the carrier life time in the lightly doped middle zone, which is flooded by both types of charge carriers. This leads to a pronounced "sag" of the charge carrier concentration in the semiconductor body.

It can be more meaningful for certain applications to diminish the concentration of the charge carriers by deteriorating the emitter efficiency. This is utilized in GTO thyristors in such fashion that the shorts are arranged at the anode side. They are arranged at the anode side so that only a few charge carriers are present from the very outset in the proximity of the emitter at the anode side. The shorts at the anode side in the GTO thyristor are constructed in a way similar to the shorts at the cathode side in the symmetrical thyristor. Since the lightly doped n-base is usually shorted, the short-circuit regions are usually considerably larger than in a thyristor shorted at the cathode side.

SUMMARY OF THE INVENTION

An object of the invention is to improve a semiconductor component of the type initially cited by designing shorts without deterioration of the blocking capability, so that a reduction of the storage charge becomes possible.

This object and other objects are achieved by the following features:

a) further zones are embedded in the outer zone adjoining the surface of the semiconductor body;

b) the further zones are of a first conductivity type and are more highly doped than the outer zone;

c) the further zones have a lower depth than the outer zone;

d) the zones of the second conductivity type arranged in the outer zone have a greater depth than the further zones and partially overlap the further zones such that a part of the surface of the further zones adjoins the outer zone;

e) the further zones and the zones of the second conductivity type are provided with at least one electrode that electrically connects these zones to one another either directly or indirectly.

DESCRIPTION OF THE PREFERRED EMBODIMENTS

Figure 1:
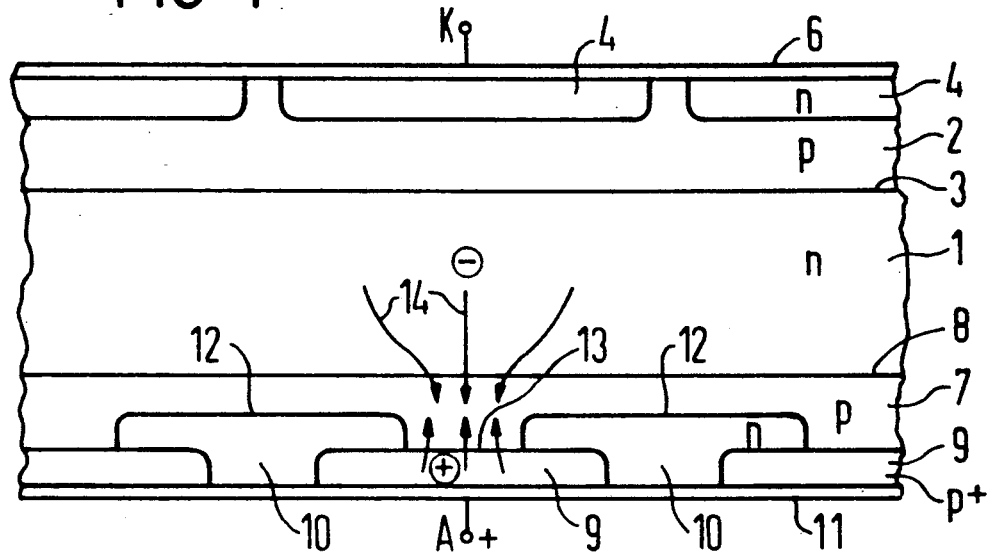
FIG. 1 is a cross section through a symmetrical thyristor of the invention.

The thyristor of FIG. 1 is symmetrically constructed with respect to its blocking capability. It contains an n-doped middle zone 1 which a p-doped cathode base zone 2 adjoins. n-doped cathode emitter zones 4 are embedded in the cathode base zone 2. The zones 2 and 4 are contacted by a cathode electrode 6, as a result whereof the short at the cathode side known from a symmetrical thyristor arises. A p-doped outer zone 7 of the anode side adjoins at the anode side of the middle zone 1. In a symmetrical thyristor, this acts as an emitter zone. Further zones 9 of the conductivity type of the outer zone 7 are embedded in the outer zone 7. Their doping, however, is higher than that of the zone 7. n-doped zones 10 are also embedded in the zone 7, these zones 10 having a greater depth than the zones 9 and less of a depth than the outer zone 7. The zones 10 overlap the further zones 9 such that some of the zones 9 are directly adjacent at the outer zone 7. The pn-junctions between the zones 9 and the zone 7 are referenced 13, the pn-junctions between the zones 10 and the zone 7 are referenced 12, and the pn-junction between the zones 1 and 7 is referenced 8. The thickness and the doping as well as the profile of the doping over the thickness thereof are the same at both sides. The pn-junctions 3 and 8 therefore can have the same blocking voltage applied.

The path that the negative charge carriers takes to the anode A given a low current density is symbolized by arrows 14 in FIG. 1. For example, such a low current density is present during turn-on. The negative charge carriers thus flow from the zone 1 predominantly directly into the zone 7 and into the zones 9. The pn-junctions 12 are inhibited and the short at the anode side is largely ineffective.

At a higher current density, the pn-junctions 12 are flooded with charge carriers and the negative charge carriers flow both into the zones 9 as well as via the pn-junctions into the zones 10. The shorts formed between the zones 9 and 10 via the anode electrode 11 are thus effective. The shorts cause a deterioration of the emitter efficiency of the outer zone 7. Thus, as measured at a thyristor without shorts at the anode side, fewer positive charge carriers are emitted therefrom into the middle zone 1. What this means is that the anode-side concentration of minority carriers is reduced, this corresponding to a reduction of the carrier storage charge.

Figure 3:
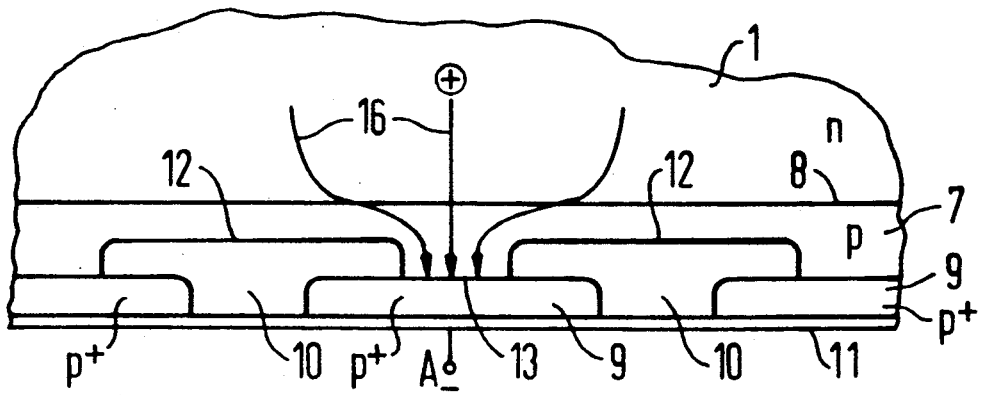

The anode-side path of the minority charge carriers in the case of commutation is shown in FIG. 3 when a potential that is negative in comparison to the cathode is present at the anode A. As symbolized by the arrows 16, the positive charge carriers are extracted from the middle zone 1 into the zone 9, and the pn-junction 8 has a blocking voltage applied to it. The conditions are similar to those during that phase in a normal thyristor wherein it can have a blocking voltage applied in the conducting direction, for example during a du/dt load or circuit-commutated load.

Figure 2:
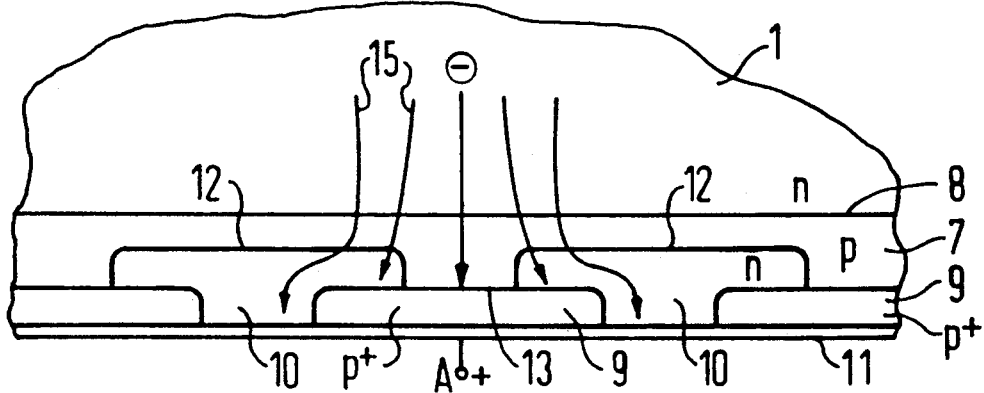
FIGS. 2 and 3 show a partial section through the thyristor of FIG. 1 with current paths during certain operating phases shown therein.
Figure 4:
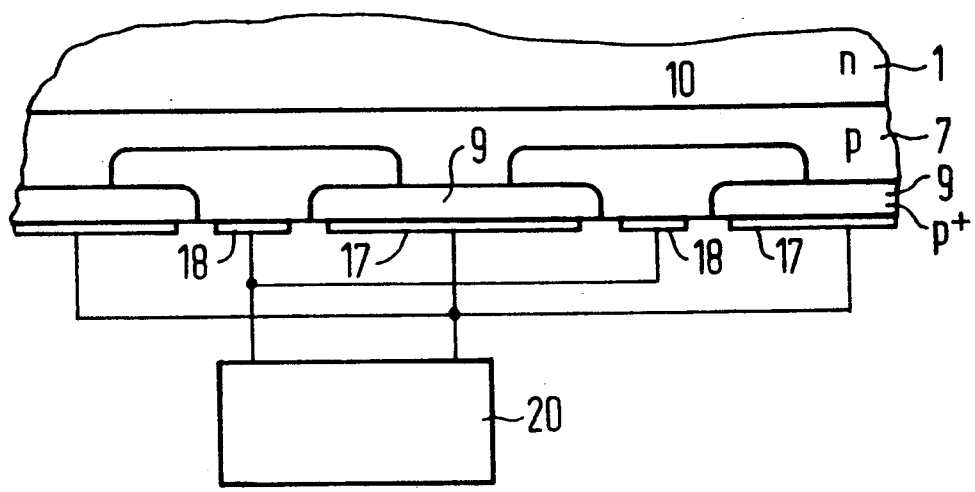
FIG. 4 is a modification of the thyristor of the invention of FIG. 3.
Figure 5:
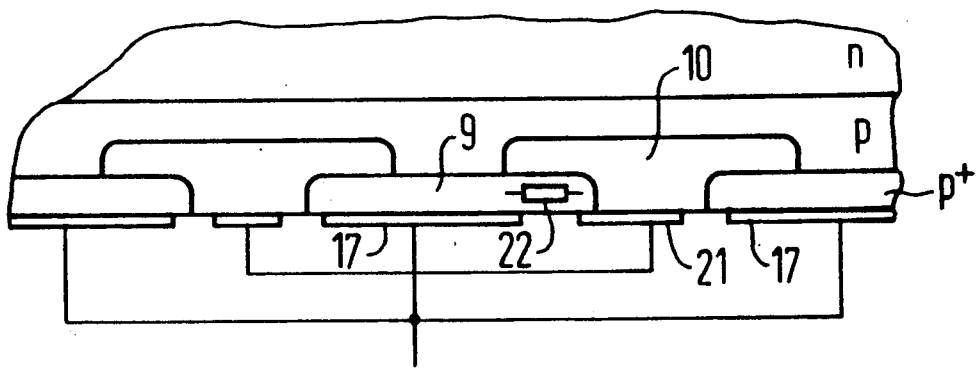
FIG. 5 is a further exemplary embodiment of the invention.

In the exemplary embodiment of FIGS. 1 through 3, the short was formed in the zones 9 and 10 which are directly connected by the anode electrode 11. As shown in FIG. 4, however, it is also possible to contact the zones 9 and 10 with electrodes 17 or 18 that are electrically separated from one another. The electrodes 17 are connected to the electrodes 18 via a circuit arrangement 20. This, for example, can contain a resistor, a switch, a passive or controllable semiconductor component, or a complex circuit arrangement with the assistance of which the short-circuit is designated to be activated, dependent on the operating condition. The exemplary embodiment of FIG. 5 differs from that of FIGS. 4 and 1 through 3 essentially in that the zones 9 are also contacted by electrodes 21 in addition to being contacted by the electrodes 17. The electrode 21 also contacts the zones 10. The electrodes 17 and 21 are at a distance from one another. The corresponding part of the zone 9 thus forms an integrated resistor 22, so that there is not a direct short between the zones 9 and 10, but a resistor connection.

The shorts of the anode side set forth for a symmetrical thyristor can be employed in the same fashion for diodes as well when the carrier concentration at the anode side is to be lowered in order, for example, to achieve a soft turn-off behavior.

The shorts of the anode set forth for a symmetrical thyristor can also be employed in modified form in specific diodes that, for example, are utilized as freewheeling diodes for GTO thyristors, and can be employed at the cathode side. In such diodes, the "tail current" must decay rapidly in order to avoid high losses. When the charge carrier densities are to be lowered both at the cathode side as well as at the anode side (Kleinmann case), then these two types of shorts can be simultaneously utilized.

Figure 6:
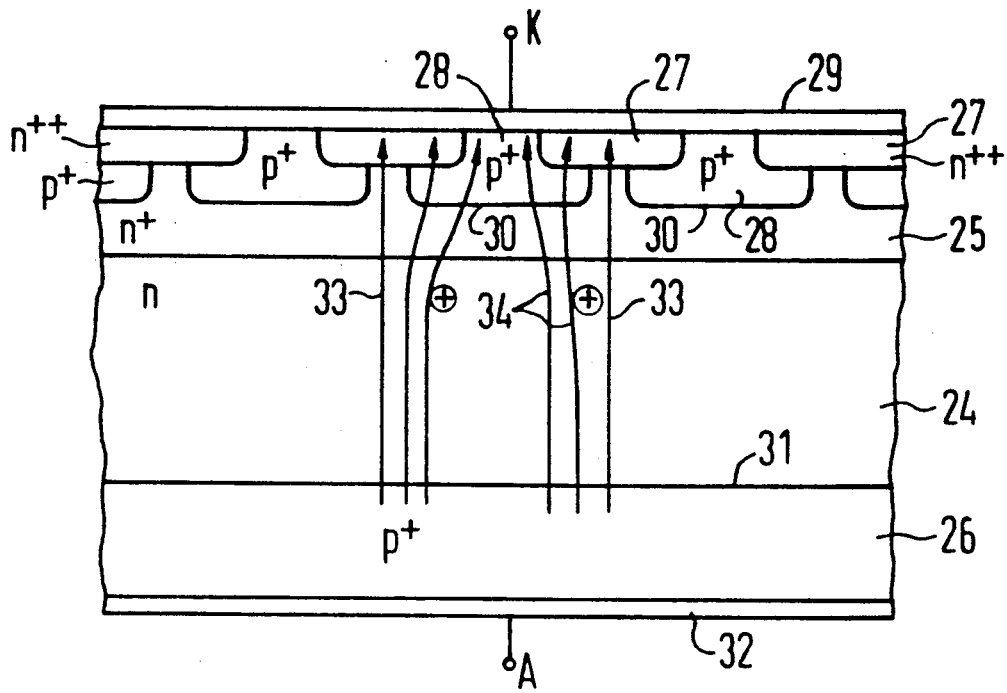
FIG. 6 is a section through a diode embodiment of the invention.

The diode of FIG. 6 has a middle zone 24 at which a cathode-side outer zone 25 as a stop layer and an anode-side outer zone 26 adjoin. The cathode-side outer zone has the same conductivity type as the middle zone 24; and the zone 26 is oppositely doped. Zones 27 of the same conductivity type as the outer zone 25 are embedded in the outer zone 25. They have a higher doping than the outer zone 25. Zones 28 of a conductivity type opposite that of the outer zone 25 are also embedded into the outer zone 25. Corresponding to the case of a thyristor, these zones have a greater depth than the zones 27, and less of a depth than the outer zone 25. The diode is contacted at the cathode side by a cathode electrode 29, and is contacted at the anode side by an anode electrode 32. A pn-junction 31 lies between the zones 24 and 26; and pn-junctions 30 lie between the zones 28 and the zone 25. When the diode is operated in a conducting direction, then, in a way analogous to the thyristor and as shown by arrows 33, positive charge carriers flow from the anode emitter zone 26, through the middle zone 24, and through the zone 27 to the cathode. Given a higher current density, the pn-junctions 30 are flooded and the current also follows a path, corresponding to the arrows 34, to the cathode via the zones 28. The emitter efficiency, and thus the carrier storage charge, of the emitter of the diode at the cathode side formed by the outer zone 25 is reduced.

The invention can also be employed for GTO thyristors having a stop layer at the anode side. GTO thyristors without such a stop layer have simple shorts at the anode side which are formed by zones whose conductivity type is opposite that of the emitter zone of the anode side. When a highly doped stop layer lies between this emitter zone and the middle zone, the conductivity of the anode side becomes higher. In order to be able to nonetheless trigger the GTO thyristor with a low current, the regions that form the shorts must have a greater spacing from one another. Similar to the case of the normal cathode short, the shorts, however, thus become largely ineffective at high current densities.

Figure 7:
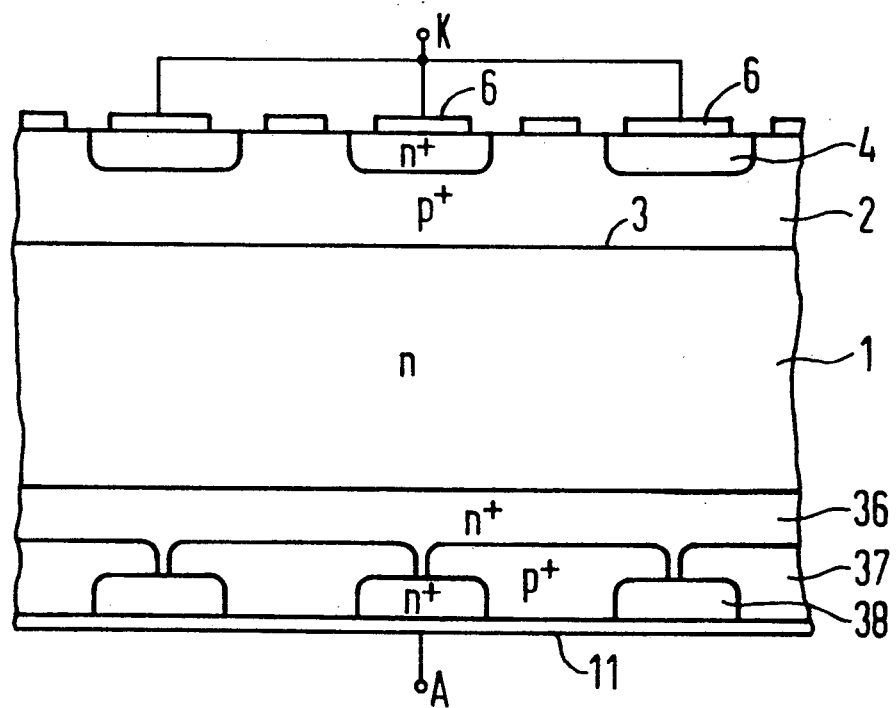
FIG. 7 is a section through a GTO thyristor having shorts according to the invention.

FIG. 7 shows a GTO thyristor wherein the short-circuit effect is preserved. The middle zone 1 is adjoined at the anode side by an outer zone 36 that acts as a stop layer. The stop layer has the same conductivity type as the middle zone 1, but has a higher doping than this middle zone 1. Zones 37 of the opposite conductivity type are embedded into the stop layer 36, these zones 37 serving as an anode emitter zone. Further zones 38 which have the same conductivity type as the stop layer 36 are embedded into the surface at the anode side. They are overlapped by the zones 37. The zones 37, 38 are contacted in common by the anode electrode 11.

The area of the zones 37 amounts to at least 90%, for example 98% of the anode-side area of the semiconductor body. As a result thereof, the current when turning on the GTO thyristor follows a path corresponding to FIG. 1 through the zone 36 across the zones 38 to the electrode 11. What this means is that the regions which effect the short-circuit amount to 2% of the anode area, given a low current density. The trigger current thus remains correspondingly low. The further zones 38 can have an overall area of 10 to 70% of the anode area. Given high current density, the hole current then follows a path corresponding to FIG. 2, whereby, for example, a hole current amounting to 50% of the overall current flows off via the shorts, and the charge carrier density at the anode side remains correspondingly low.

Although various minor changes and modifications might be proposed by those skilled in the art, it will be understood that I wish to include within the claims of the patent warranted hereon all such changes and modifications as reasonably come within my contribution to the art.

I claim as my invention:

1. A semiconductor component, comprising:
a semiconductor body with a lightly doped middle zone and a more highly doped outer zone of fir st conductivity type adjacent thereto;
first zones of second conductivity type arranged in the outer zone and at a surface of the semiconductor body;
second zones of first conductivity type which are more highly doped than the outer zone and whcih are embedded into the outer zone adjacent to said surface of the semiconductor body;
said second zones having a depth which is less than a depth of the outer zone;
said first zones having a depth which is greater than the depth of the second zones and which overlap the second zones partially such that a part of a surface of the second zones adjoins the outer zone; and the second zones and the first zones being provided with means for electrically connecting the first and second zones to one another so that shorts are provided between the outer zone and the first zones.

2. A semiconductor component according to claim 1 wherein the outer zone is an anode-side emitter zone of a symmetrically blocking thyristor, the conductivity type of the anode-side emitter zone being opposite to the conductivity type of the middle zone.

3. A semiconductor component according to claim 1 wherein the means for electrically connecting comprises an electrode which directly electrically connects the first and second zones to one another.

4. A semiconductor component according to claim 3 wherein the means for electrically connecting comprises a common electrode overlying the surface of the semiconductor body and which is in contact with the first zones and second zones.

5. A semiconductor component according to claim 1 wherein the means for electrically connecting comprises separate electrodes on the first and second zones and the separate electrodes being connected together through a circuit.

6. A semiconductor component according to claim 1 wherein the means for electrically connecting comprises electrodes on the first zones and electrodes on the second zones which are connected by wiring.

7. A semiconductor component according to claim 1 wherein the means for electrically connecting comprises electrodes on the first zones and electrodes on the second zones which are connected via a controllable switch.

8. A semiconductor component according to claim 1 wherein the means for electrically connecting comprises electrodes on the first zones and electrodes on the second zones which are connected via a resistor.

9. A semiconductor component according to claim 1 wherein the means for electrically connecting comprises electrodes on the first zones and electrodes on the second zones which are connected via a semiconductor component.

10. A semiconductor component according to claim 1 wherein the mans for electrically connecting comprises electrodes on the first zones and electrodes on the second zones and wherein at least one of the electrodes of the first zones overlaps onto at least one of the second zones.

11. A semiconductor component according to claim 1 wherein the outer zone is an anode-side emitter zone of a diode.

12. A semiconductor component according to claim 1 wherein both a cathode side as well as an anode side are provided with shorts.

13. A semiconductor component according to claim 1 wherein the outer zone is a cathode-side stop layer of a diode.

14. A semiconductor component according to claim 1 wherein the outer zone is an anode-side stop layer of a GTO thyristor.

15. A semiconductor component according to claim 14 wherein a sum of area of the first zones amounts to at least 90% of an anode side area of the semiconductor body.

16. A semiconductor component, comprising:
a semiconductor body with a middle zone, and an outer zone of first conductivity type adjacent the middle zone;
first zones of second conductivity type arranged in the outer zone and at a surface of the semiconductor body;
second zones of first conductivity type which are more highly doped than the outer zone and which are embedded into the outer zone adjacent to said surface of the semiconductor body;
said first zones having a depth which is greater than a depth of the second zones and which overlap the second zones partially such that a part of a surface of the second zones adjoins the outer zone; and
the second zones and the first zones being provided with electrode means for use in electrically connecting the first and second zones to one another.

17. A semiconductor component according to claim 14 wherein a sum of areas of the second zones amounts to between 10 and 70% of an anode-side area of the semiconductor body.

* * * * *